United States Patent
Higuchi (10) Patent No.: US 7,034,536 B2
(45) Date of Patent: *Apr. 25, 2006

(54) INCLINED MAGNETIC FIELD GENERATION COIL AND MAGNETIC FIELD GENERATOR FOR MRI

(75) Inventor: Dai Higuchi, Fukui-ken (JP)

(73) Assignee: Shin-Etsu Chemical Co. Ltd., (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/948,605

(22) Filed: Sep. 23, 2004

(65) Prior Publication Data

US 2005/0035765 A1   Feb. 17, 2005

Related U.S. Application Data

(63) Continuation of application No. 10/192,603, filed on Jul. 10, 2002, now Pat. No. 6,809,519.

(30) Foreign Application Priority Data

Jul. 12, 2001 (JP) .............................. 2001-212373
Sep. 4, 2001 (JP) .............................. 2001-266636

(51) Int. Cl.
  *G01V 3/00* (2006.01)
(52) U.S. Cl. ...................................... 324/319; 335/216
(58) Field of Classification Search ................ 324/319, 324/318, 320, 322, 300; 335/216, 301
See application file for complete search history.

(56) References Cited

U.S. PATENT DOCUMENTS

| 5,124,651 A | 6/1992 | Danby et al. ................ 324/318 |
| 5,446,434 A * | 8/1995 | Dorri et al. ................... 335/301 |
| 6,014,070 A | 1/2000 | Danby et al. ................ 355/296 |
| 6,075,363 A | 6/2000 | Sellers et al. ................ 324/318 |
| 6,275,128 B1 | 8/2001 | Aoki et al. ................... 335/299 |
| 6,275,129 B1 * | 8/2001 | van Oort ...................... 335/301 |
| 6,311,389 B1 | 11/2001 | Uoaski et al. ................. 29/605 |
| 6,404,202 B1 | 6/2002 | Damadian et al. ........... 324/318 |
| 6,566,991 B1 * | 5/2003 | Rimkunas et al. ........... 335/301 |
| 6,707,359 B1 * | 3/2004 | Yoshida et al. .............. 335/216 |
| 6,778,054 B1 * | 8/2004 | Huang et al. ................ 335/301 |
| 6,809,519 B1 * | 10/2004 | Higuchi ....................... 324/318 |

FOREIGN PATENT DOCUMENTS

JP    63-65848/88 A    3/1988

* cited by examiner

Primary Examiner—Louis M. Arana
(74) Attorney, Agent, or Firm—Myers Bigel Sibley & Sajovec (57) ABSTRACT

The present invention provides a magnetic field generator for MRI in which, by simplifying the component parts of the pole pieces incorporated therein, the magnetic field generator for MRI can be manufactured at a lower cost without detracting from its magnetic characteristics. Specifically, the present invention provides an inclined magnetic field generation coil for use in a magnetic field generator for MRI, the coil comprising a plurality of magnetic field regulating holes (17), an electric conductor in coiled form, and a resin base. Moreover, it also provides a magnetic field generator for MRI comprising a pair of permanent magnets magnetized in the direction of the thickness and opposed to each other with a gap left therebetween, and a pair of pole pieces having a peripheral projection and disposed on the opposed faces of the respective permanent magnets, in order to create a uniform magnet field space between the pole pieces, the magnetic field generator further comprising an inclined magnetic field generator (9) disposed within each of the pole pieces and having a mechanism (17) for regulating the magnetic field nonuniformity of the uniform magnet field space.

8 Claims, 7 Drawing Sheets

INCLINED MAGNETIC FIELD GENERATION COIL AND MAGNETIC FIELD GENERATOR FOR MRI

CLAIM FOR PRIORITY AND CROSS-REFERENCE TO OTHER APPLICATIONS

This application is a continuation application of U.S. patent application Ser. No. 10/192,603 filed Jul. 10, 2002, now U.S. Pat. No. 6,809,519 and claims priority from Japanese Patent Application No. 2001-212373 filed Jul. 12, 2001, and Japanese Patent Application No. 2001-266636 filed Sep. 4, 2001, the disclosures of which are hereby incorporated by reference in their entirety.

BACKGROUND OF THE INVENTION

1. Field of the invention

This invention relates to an inclined magnetic field generation coil and a magnetic field generator which are used in a magnetic resonance imager (MRI).

2. Description of the related art

MRI is an imaging apparatus using a magnetic resonance phenomenon and is being extensively used for purposes of medical diagnosis and the like. Conventionally, normal conducting electromagnets, superconducting electromagnets and the like have been used for the generation of a magnetic field for MRI. However, as a result of the recent development of high-performance rare-earth permanent magnets, it has become a major trend to use rare-earth permanent magnets (hereinafter referred to briefly as "permanent magnets") for the generation of a magnetic field for MRI, for example, in MRIs having a low magnetic field of 0.5 T or less.

Figure 10:
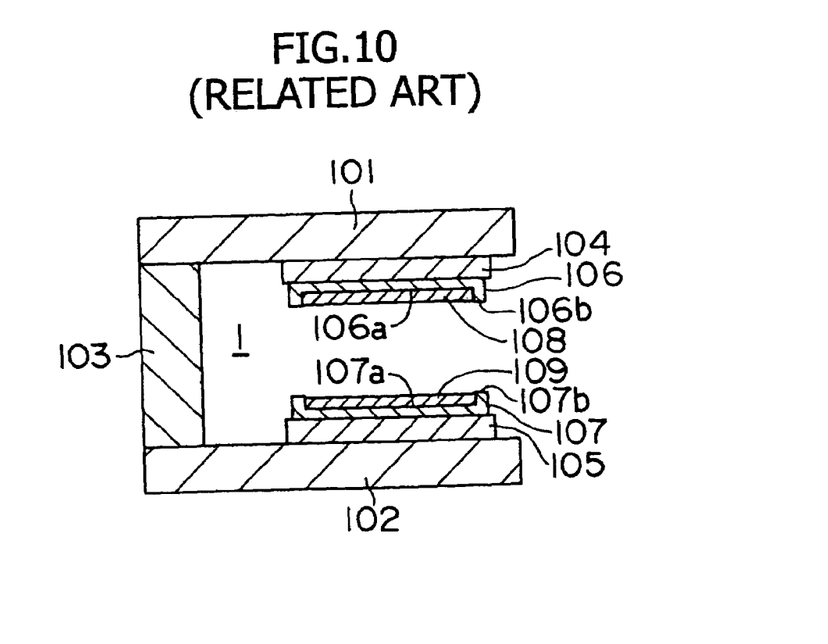
FIG. 10 is a cross-sectional view of a conventional magnetic field generator as viewed from the side.

A conventional magnetic field generator for MRI and the pole pieces and other components used therein are described below with reference to FIG. 10. FIG. 10 is a cross-sectional view of a magnetic field generator for MRI as viewed from the side. In FIG. 10, plate-like yokes 101 and 102 are supported by a columnar yoke 103. On this pair of plate-like yokes 101 and 102, generally discoidal permanent magnets 104 and 105 selected from the group consisting of Nd—Fe—B, Sm—Co and Sm—N—Fe magnets are disposed so as to face each other. Moreover, pole pieces 106 and 107 having a circular base are attached to the opposed faces of permanent magnets 104 and 105, respectively.

Permanent magnets 104 and 105 are each magnetized along the thickness, keeping the direction of magnetization from being antiparallel.

On the other hand, peripheral projections 106b and 107b are provided along the periphery of pole pieces 106 and 107 (i.e., the periphery of their bases), respectively. These peripheral projections 106b and 107b serve to produce a magnetic field having a uniform strength substantially in the center of the space between pole pieces 106 and 107, and these projections have an approximately constant height. Bases 106a, 107a and peripheral projections 106b, 107b are formed, for example, of a soft magnetic material laminated onto a soft iron material such as low-carbon steel or pure iron.

In the recesses on the gap side of pole pieces 106 and 107, a pair of inclined magnetic field generators 108 and 109 are disposed in order to produce an inclined magnetic field on the gap side of the opposed pole pieces. The main purpose of this inclined magnetic field generator is to act on the uniform magnetic field space on the gap side of the pole pieces and thereby disturb the uniformity of the magnetic field linearly by intention. Then, if NMR signals including the nonuniform magnetic field are received, spatial information can be added during image formation from the signals. In an ordinary magnetic field generator for MRI, three inclined magnetic field coils arranged orthogonally so as to coincide with the X-axis, Y-axis and Z-axis of a three-dimensional coordinate system. The technology of inclined magnetic field coils is described, for example, in Japanese Patent Provisional Publication No. 63-65848/'88.

Figure 11:
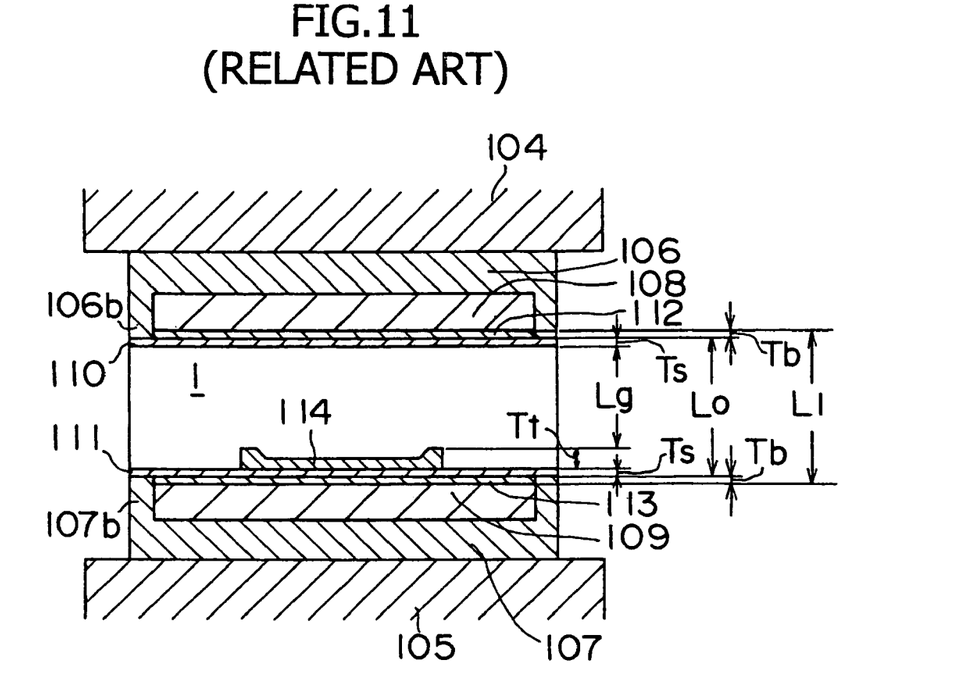
FIG. 11 is an enlarged cross-sectional view of the pole piece regions shown in FIG. 10.

Now, referring to FIG. 11 which is an enlarged cross-sectional view of the pole piece regions shown in FIG. 10, the construction of the pole piece regions on the gap side of the inclined magnetic field generator is described in greater detail. For example, on the gap side of inclined magnetic field generators 108 and 109, RF wave transmitters (also called transmission coils) 110 and 111, magnetic field regulation mechanisms 112 and 113, a subject carrying table 114, and the like are usually mounted. Thus, the effective gap length of an actual magnetic field generator for MRI is expressed by the following equation (1)

$$Lg = L0 - (2 \times Ts + Tt) \quad (1)$$

or by the following equation (2)

$$Lg = L1 - \{2 \times (Ts + Tb) + Tt\} \quad (2)$$

The symbols in these equations are defined as follows.

Lg: Effective gap length.

L0: Gap-side distance between peripheral projections 106b and 107b.

L1: Gap-side distance between inclined magnetic field coils 108 and 109.

Ts: Thickness of transmission coil

Tt: Thickness of subject carrying table

Tb: Thickness of magnetic field regulation mechanism.

These equations (1) and (2) indicate that the space available for the imaging of a subject is gradually narrowed by the mounting of various component parts.

Figure 12:
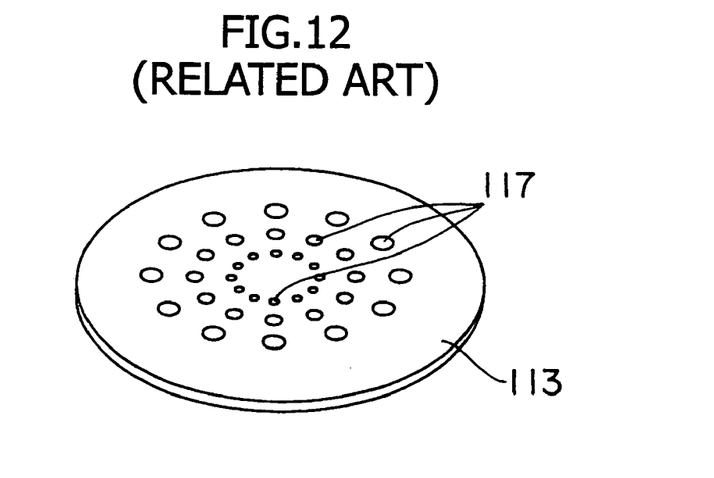
FIG. 12 is a perspective view illustrating a conventional magnetic field regulation mechanism.

The aforesaid magnetic field regulation mechanisms 112 and 113 disposed on the gap side of the inclined magnetic field coils serves as a tool for making a final magnetic field adjustment during installation in a hospital or the like. For example, each of them comprises a resin plate having about 10 to 200 magnetic field regulating holes 117 formed therein, as illustrated in FIG. 12. By inserting any desired magnet pieces or magnetic material pieces (e.g., iron pieces) into the regulating holes, the magnetic field uniformity on the gap side of the pole pieces can be enhanced. However, since the number of holes is large and a high machining accuracy is required, the magnetic field regulation mechanisms are regarded as one of the cost-raising factors among various component parts of the magnetic field generator for MRI.

SUMMARY OF THE INVENTION

It is very important that magnetic field generators for MRI, including permanent magnet type ones, facilitate the imaging and diagnosis of subjects, though it-naturally depends on the intended purpose. To this end, it is first required to widen the effective gap between the opposed pole pieces as much as possible. For example, in the case of the magnetic field generator illustrated in FIG. 10, it would be highly desirable to reduce the thicknesses of the component parts assembled into the pole pieces, because this enables efficient utilization of the effective gap. In practice, however, the permanent magnets, the pole pieces, the inclined magnetic field coils and the magnetic field regulation mechanisms are stacked as illustrated in FIG. 11, so that the gap is narrowed to hinder the production of a uniform magnetic field and, moreover, the space available for imaging purposes is limited.

Accordingly, an object of the present invention is to provide a magnetic field generator for MRI in which, by simplifying the component-parts of the pole pieces incorporated therein, the magnetic field generator for MRI can be manufactured at a lower cost without detracting from its magnetic characteristics.

That is, the present invention provides an inclined magnetic field generation coil for use in a magnetic field generator for MRI, the coil comprising a plurality of magnetic field regulating holes, an electric conductor in coiled form, and a resin base. Moreover, it also provides a magnetic field generator for MRI comprising a pair of permanent magnets magnetized in the direction of the thickness and opposed to each other with a gap left therebetween, and a pair of pole pieces having a peripheral projection and disposed on the opposed faces of the respective permanent magnets, in order to create a uniform magnet field space between the pole pieces, the magnetic field generator further including an inclined magnetic field generator disposed within each of the pole pieces and having a mechanism for regulating the magnetic field nonuniformity of the uniform magnet field space.

As described above, the present invention permits omission of the conventional magnetic field regulation mechanisms because a magnetic field regulation mechanism is provided in the surface, or in the interior, of the inclined magnetic field generator (i.e., the inclined magnetic field generation coil). This makes it possible to reduce the cost of the magnetic field generator for MRI and also to increase the effective gap length and thereby produce a uniform magnetic field.

BRIEF DESCRIPTION OF THE DRAWINGS

FIGS. 5(1) and 5(2) are cross-sectional views illustrating two embodiments of the inclined magnetic field generator of the present invention, and FIG. 5(3) is a cross-sectional view illustrating a lower inclined magnetic field generator having magnetic field regulating holes into which a fine adjustment magnet or a ferromagnetic material is inserted;

DETAILED DESCRIPTION OF THE PREFERRED EMBODIMENTS

The present inventor has now found that a magnetic field regulation mechanism for maintaining the uniform magnetic field space generated by the magnetic field generator for MRI illustrated in FIG. 10, is added to the surface or inside of the inclined magnetic field generator without interference with the wiring system of the inclined magnetic field generator, so that the imaging and diagnosis of a subject can be carried out, keeping the imaging area from narrowing and the imaging quality from worsening. The present invention has been completed on the basis of these findings.

The basic construction and principle of the present invention are generally correspond, for example, to those of the conventional magnetic field generator for MRI illustrated in FIG. 10. Since an explanation has been made with reference to FIG. 10, the description of the component parts of a magnetic field generator for MRI which are not directly related to the present invention will be omitted or restricted to giving an outline.

Figure 1:
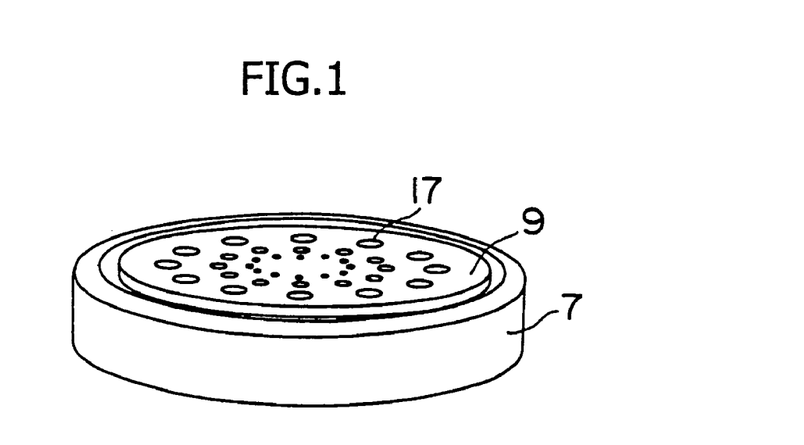
FIG. 1 is a perspective view of a lower pole piece in accordance with one embodiment of the present invention.

Now, an embodiment of the present invention is described with reference to FIG. 1. The present invention is concerned with the component parts of the upper and lower pole pieces. However, in order to facilitate the understanding of the construction of the present invention, only a lower pole piece 7 in accordance with this embodiment is illustrated in FIG. 1. FIG. 1 is a perspective representation of the lower pole piece from which the yoke, the permanent magnet and the like have been removed.

The pole piece used in the present invention may have a base and a peripheral projection formed along the periphery of the base. The pole piece is made chiefly of a soft magnetic material selected from soft-iron materials such as low-carbon steel and pure iron, and other materials having a high saturated magnetic flux density. The term "soft magnetic material" as used herein means any material having a small hysteresis area and a high magnetic permeability. In some cases, a soft magnetic material (e.g., a silicon steel plate) showing directional magnetization may be used or disposed in the part of the pole piece facing the gap. This serves to minimize eddy currents and remanent magnetization due to an alternating magnetic field produced by the inclined magnetic field generator incorporated in the pole piece. Various conditions such as the thickness and radial dimension of the pole piece are restricted by the magnetic field strength produced by the magnetic circuit, the mechanical strength, the uniformity of the magnetic field, and the like, and may hence be suitably determined according to these factors.

The peripheral projection is provided to maintain the uniformity of the magnetic field space. The term "uniform magnetic field" as used herein means a magnetic field having a degree of uniformity which is allowable for use as a magnetic field generator for MRI. It is usually regarded as satisfactory that the maximum and minimum values fall within the limits of ±50 ppm from the mean value of the magnetic field. The area of the peripheral projection is preferably in the range of 10 to 30% of the total area of the pole piece.

The present invention is characterized by the omission of magnetic field regulation mechanisms 112 and 113 described above in connection with FIGS. 10 and 11. The reason for this is that the thickness of each magnetic field regulation mechanism on the gap side of the pole piece is about 10 mm or greater and the combined thickness of the pair of (upper and lower) magnetic field regulation mechanisms amounts to 20 mm or greater. The omission of the magnetic field regulation mechanisms makes it possible to reduce the thickness of the apparatus, widen the effective gap significantly, and achieve a marked reduction in cost.

However, the mere omission of magnetic field regulation mechanisms 112 and 113 will fail to provide satisfactory magnetic field uniformity at the time of adjustment on the spot (i.e., imaging in a hospital or the like) and to produce a sufficient cost-reducing effect. Accordingly, the present invention is based on the finding that a spot adjustment can be performed by adding a magnetic field regulation mechanism to the inclined magnetic field generator constructed in each pole piece.

Now, an inclined magnetic field generator (preferably, an inclined magnetic field coil having a magnetic field regulation mechanism) in accordance with one embodiment of the present invention are more specifically described with reference to FIGS. 2 to 6.

The inclined magnetic field generator is a magnetic field generation part formed in each pole piece, and comprises an inclined magnetic field coil 9, magnetic field regulating holes 17 and a resin base 16. This inclined magnetic field generator is characterized in that it does not project above the height of the pole piece. The coil generally comprises copper wires and has the function of adjusting the magnetic field finally. The size of the inclined magnetic field generator is usually such that, depending on the size of the uniform magnetic field space, its area as viewed from the gap side of the pole piece comprises about 60 to 90% of the area of the pole piece.

Figure 2:
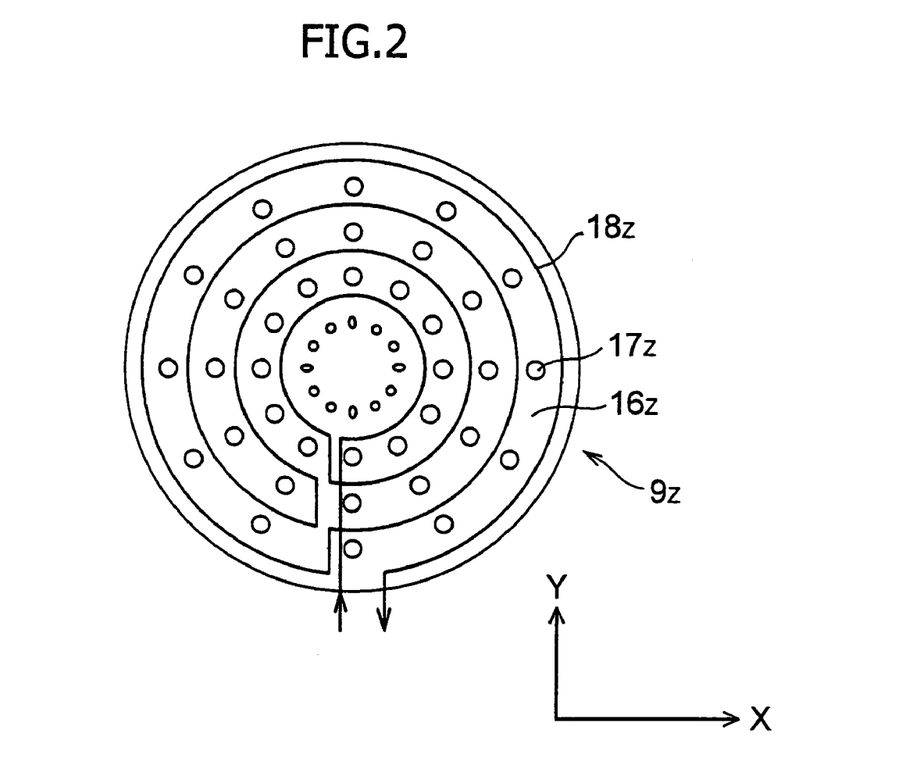
FIG. 2 is a plan view of an inclined magnetic field coil in accordance with this embodiment as view from the gap side of the pole piece, schematically showing the configuration of an electric conductor disposed therein.
Figure 3:
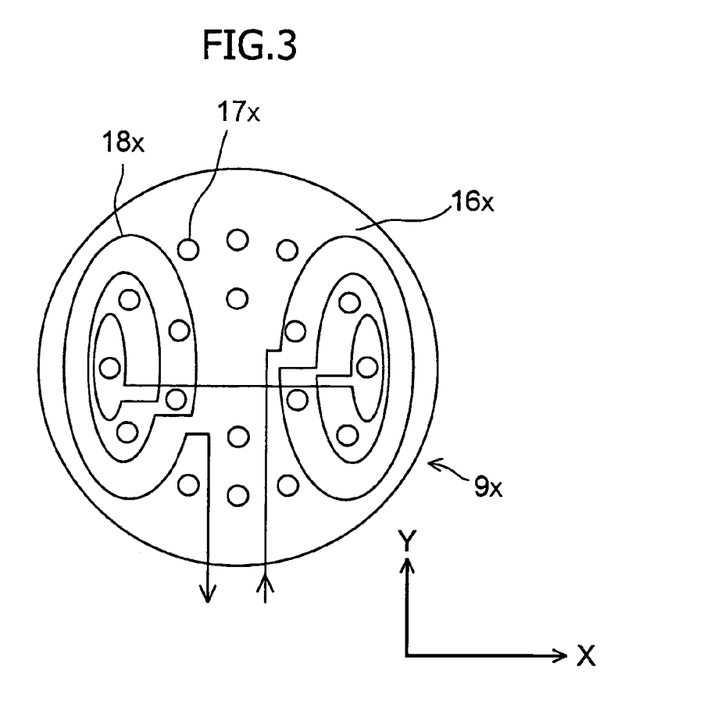
FIG. 3 is a plan view of an inclined magnetic field coil in accordance with this embodiment as view from the gap side of the pole piece, schematically showing the configuration of an electric conductor disposed therein.
Figure 4:
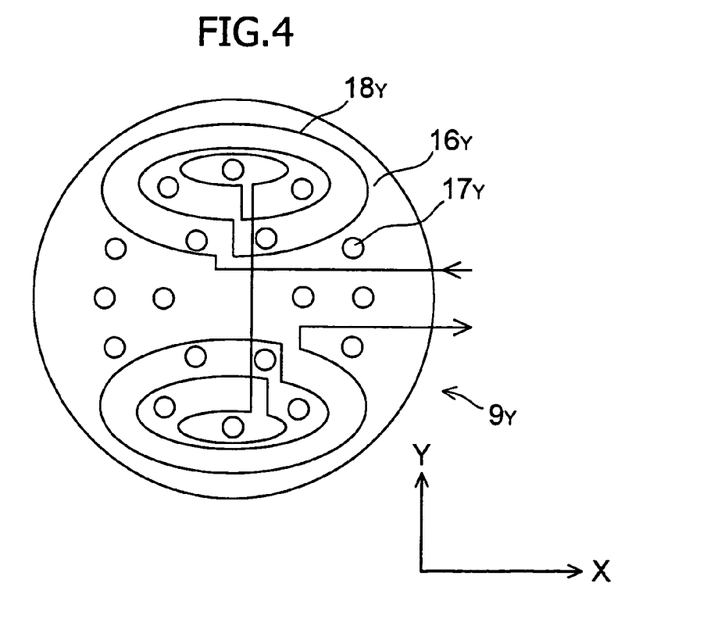
FIG. 4 is a plan view of an inclined magnetic field coil in accordance with this embodiment as view from the gap side of the pole piece, schematically showing the configuration of an electric conductor disposed therein.
Figure 5:
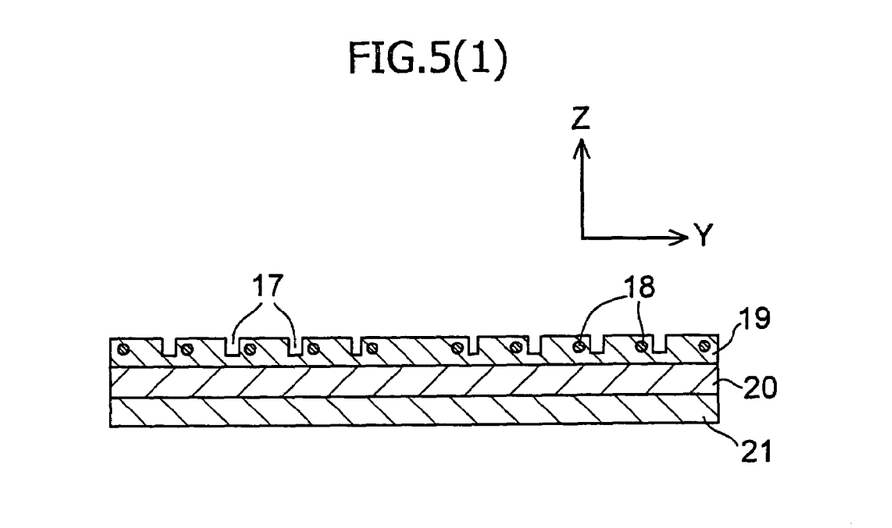

FIGS. 2 to 4 are plan views of several exemplary inclined magnetic field coils in accordance with this embodiment as viewed from the gap side of the pole piece, schematically showing the configuration of an electric conductor 18 disposed therein. Each inclined magnetic field coil comprises X-axis, Y-axis and Z-axis inclined magnetic field coils, and any of them may be used on the gap-side surface. FIGS. 2, 3 and 4 illustrate examples in which the Z-axis, X-axis and Y-axis inclined magnetic field coils, respectively, are used on the gap-side surface.

Figure 6A:
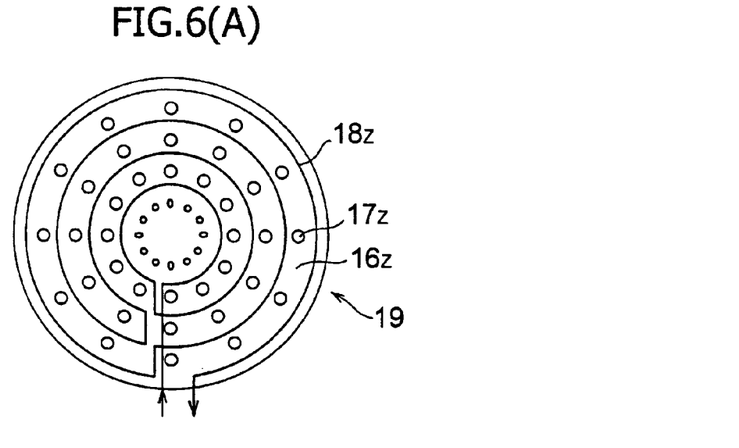
FIG. 6(A), 6(B) and 6(C) are views illustrating the wiring of a Z-axis inclined magnetic field coil, an X-axis inclined magnetic field coil and a Y-axis inclined magnetic field coil, respectively.
Figure 6B:
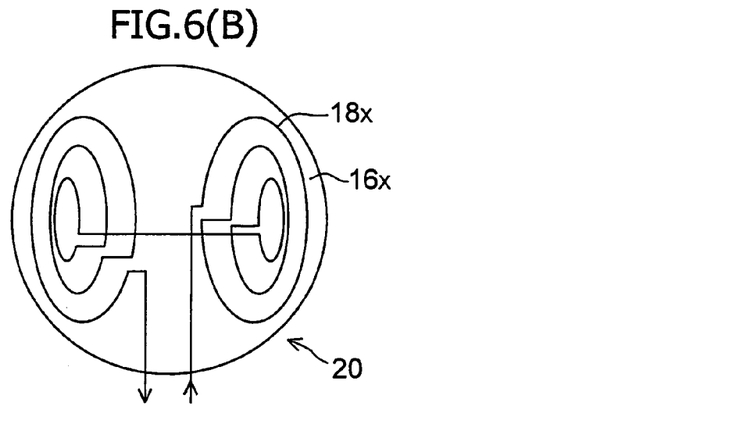
Figure 6C:
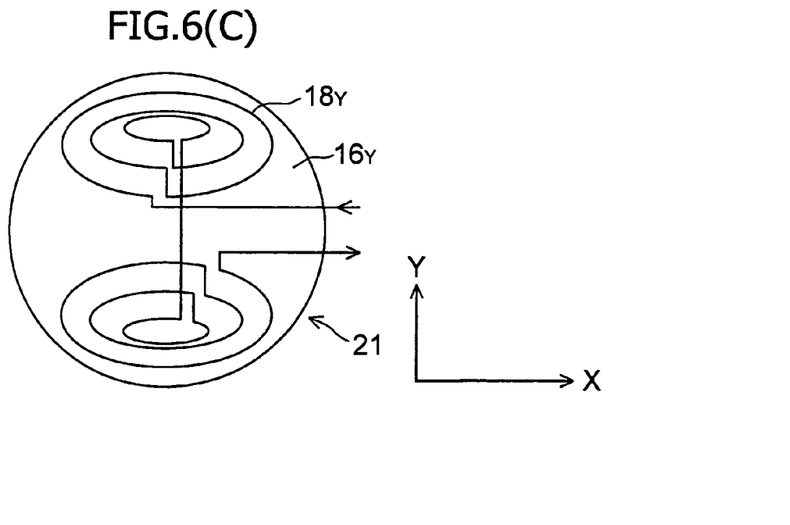

FIG. 5(1) is a cross-sectional view of an inclined magnetic field coil as viewed from the same direction as in FIG. 11. In this example, the inclined magnetic field coil comprises a combination of a Z-axis inclined magnetic field coil 19, an X-axis inclined magnetic field coil 20 and a Y-axis inclined magnetic field coil 21. In Z-axis inclined magnetic field coil 19, resin regions and magnetic-field regulating holes are formed between electric conductor segments. The coil wiring in Z-axis inclined magnetic field coil 19, X-axis inclined magnetic field coil 20 and Y-axis inclined magnetic field coil 21 shown in FIG. 5(1) is shown in FIGS. 6(A), 6(B) and 6(C), respectively.

Although any of the X-axis, Y-axis and Z-axis inclined magnetic field coils may be used alone in the present invention, it is preferable to use a plurality of coils in stacked relationship. More preferably, the X-axis, Y-axis and Z-axis inclined magnetic field coils are used in stacked relationship. No particular limitation is placed on the order in which the X-axis, Y-axis and Z-axis inclined magnetic field coils are stacked, and any wiring layer may be formed on the gap-side surface, provided that there is a layer for forming holes in the gap-side surface or the pole piece-side surface. In addition to the layer for forming holes in the gap-side surface or the pole piece-side surface, magnetic field regulating holes may be formed in the intermediate layer. Moreover, an embodiment in which holes extend from the gap-side surface to the pole piece-side surface is possible. It is also possible to form holes in both the gap-side surface and the pole piece-side surface.

FIG. 5(2) illustrates an inclined magnetic field generation means in which magnetic field regulating holes are formed in the pole piece-side surface, without forming holes in the gap-side surface. Also in this case, the gap is not narrowed and the magnetic field uniformity is not detracted from.

In the present invention, the magnetic field regulating holes used as a magnetic field regulation mechanism are preferably arranged so as not to interfere with the electric conductor disposed in the coil. Thus, the magnetic field regulating holes are devised so as not to hinder the application of an inclined magnetic field, and may hence extend to the pole piece side.

The inclined magnetic field generator formed in the pole piece is disposed on a permanent magnet base and serves to produce a uniform magnetic field.

The resin base, which serves to fix the electric conductor, may be selected from electrical insulating resins such as acrylic resins, epoxy resins, silicone resins, polyimides and reinforced plastics. The electric conductor may be also covered with resin from above. The regulating holes may be formed in the surface of the inclined magnetic field generator or in the regions between adjacent electric wire segments. Although the regulating holes do not extend through the inclined magnetic field generator, the present invention also comprehends an embodiment in which the regulating holes extend through the resin layer.

Figure 7:
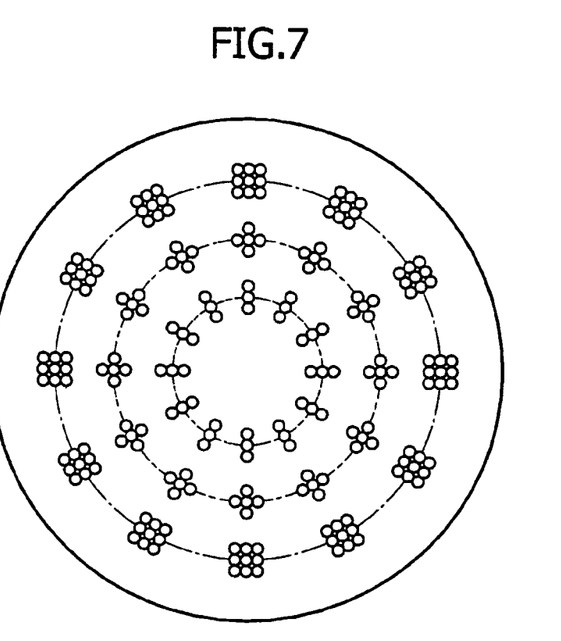
FIG. 7 is a plan view illustrating an embodiment of the inclined magnetic field-generator of the present invention.
Figure 8:
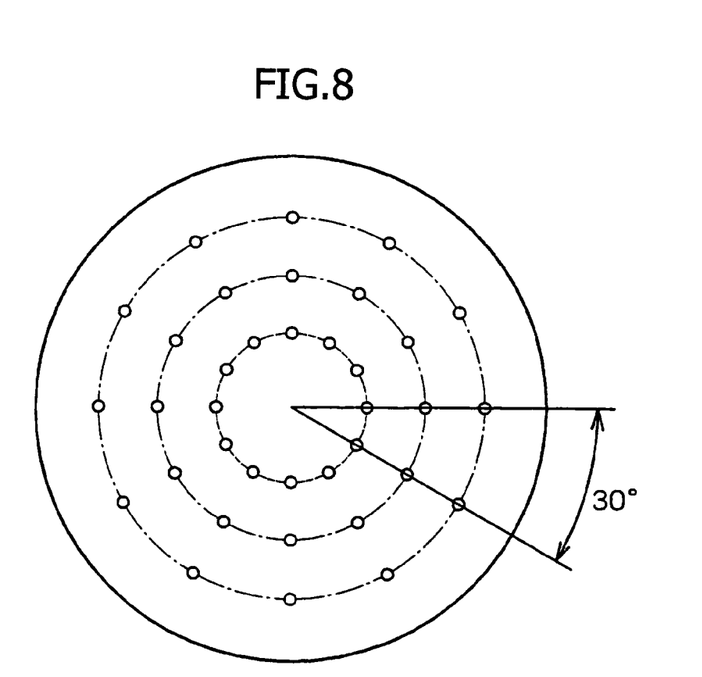
FIG. 8 is a plan view illustrating an embodiment of the inclined magnetic field generator of the present invention.

The number and size of the formed holes may be determined especially in accordance with the degree of magnetic field regulation. When the target uniformity to be attained based on the regulation and the diameter size of the magnetic uniform space is high, the number or size of the holes will be increased. Thus, in accordance with the purposes, 10 to 600 holes having a diameter size at which the wiring of the inclined magnetic field generator does not interfere are formed. As illustrated in FIG. 7, it is preferable that, as it goes to the outside, the diameter of holes is enlarged or the number of holes is increased. In addition, the percentage of total cross-sectional areas of the magnetic field regulating holes in a cross-sectional area of the inclined magnetic field generator within the pole piece may be preferably 3 to 80%, although the percentage naturally depends on size or uniformity of the uniform space. When any one of the X-axis, Y-axis and Z-axis inclined magnetic field coils is used alone, the percentage for the total cross-sectional areas of the magnetic field regulating holes of the single wiring layer may be 3 to 80%. When plural wiring layers selected from the group consisting of the X-axis, Y-axis and Z-axis inclined magnetic field coils are used, the percentage for the total cross-sectional areas of the magnetic field regulating holes of at least one wiring layer thereof may be 3 to 80%. Alternatively, as illustrated in FIG. 8, the magnetic field space can be made uniform by forming holes at regular angular intervals (of 15 to 90 degrees) along selected circles (having appropriate diameters), though it depends on the manner of wiring.

Moreover, the magnetic field can be regulated by inserting any desired magnets smaller than the size of regulating holes (e.g., rare-earth permanent magnets or magnetic material pieces such as iron pieces) into some regulating holes. The regulating holes undergoing the insertion of such magnets may be regulating holes formed in the gap-side surface, regulating holes formed in the pole piece-side surface, or regulating holes formed so as to extend from the gap-side surface to the pole piece side. The inclined magnetic field generator illustrated in FIG. 5(3) is a lower inclined magnetic field generator 9 in which magnetic field regulating holes are formed on the pole piece side similarly to the inclined magnetic field generation means of FIG. 5(2). This inclined magnetic field generator 9 has magnetic field regulating holes 17', magnetic field regulating holes 17'm having inserted thereinto fine adjustment magnets or ferromagnetic material pieces (e.g., iron pieces) attached to pole piece 7, and an electric conductor 18 embedded in the coil. A transmission coil 11 is also shown in FIG. 5(3).

The mechanism for performing a fine adjustment of the magnetic field nonuniformity of the uniform magnetic field space preferably comprises magnetic field regulating holes. The fine adjustment of the magnetic field can be performed by inserting various magnets or ferromagnetic material pieces into one or more holes while altering the size or quantity thereof. There may be vacant holes into which no magnet or the like is inserted. No particular limitation is placed on the magnets used for purposes of fine adjustment, and there may be used ferrite magnets, rare-earth magnets and the like.

Inclined magnetic field coils having an electric conductor, magnetic field regulating holes and a resin base 16 may be made according to any conventional forming process. According to one typical example thereof, three disks formed of an electrical insulating resin are provided for X-axis, Y-axis and Z-axis components. Each disk is machined to form a groove according to the coil wiring pattern. An electric wire is placed in the groove and encapsulated. Then, the surface of the disk is machined to form magnetic field regulating holes. Finally, the three disks for X-axis, Y-axis and Z-axis components are stacked and bonded with an adhesive or the like to complete an inclined magnetic field coil.

Figure 9:
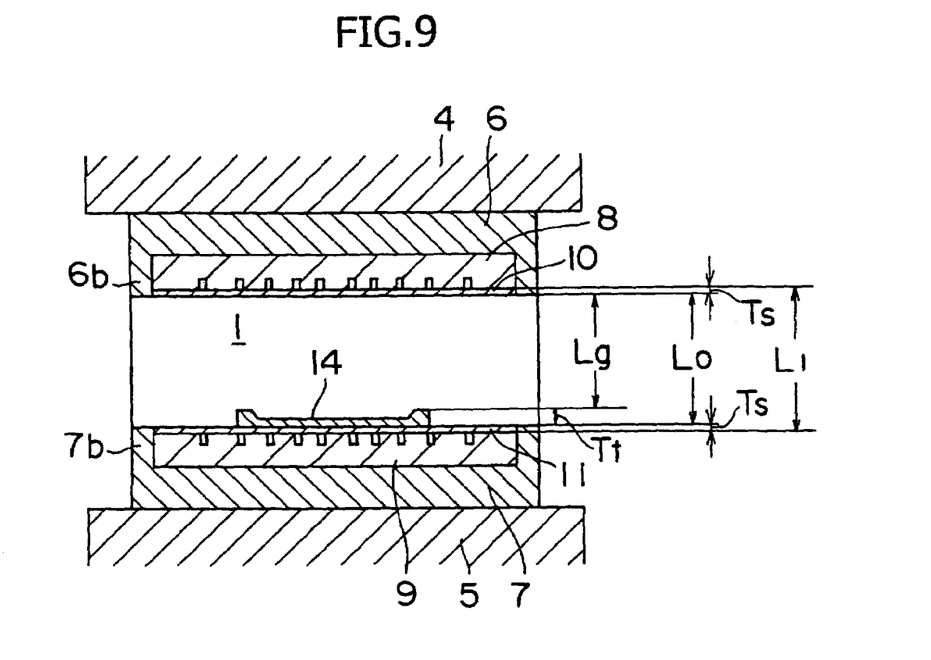
FIG. 9 illustrates a magnetic field generator in accordance with one embodiment of the present invention.

FIG. 9 is a cross-sectional view of a magnetic field generator for MRI in accordance with one embodiment of the present invention as viewed from the side of the apparatus. Although they are not shown, plate-like yokes 1 and 2 are supported by a columnar yoke 103. On this pair of plate-like yokes 1 and 2, generally discoidal permanent magnets 4 and 5 are disposed so as to face each other. Moreover, pole pieces 6 and 7 having a circular base are attached to the opposed faces of permanent magnets 4 and 5, respectively. Furthermore, peripheral projections 6b and 7b are provided along the periphery of pole pieces 6 and 7. In the recesses on the gap side of pole pieces 106 and 107, a pair of inclined magnetic field generators 8 and 9 are disposed in order to produce an inclined magnetic field on the gap side of the opposed pole pieces. On the gap side of inclined magnetic field generators 8 and 9, RF wave transmitters (also called transmission coils) 10 and 11, a subject carrying table 114 and the like are usually mounted. Magnetic field regulation mechanisms 112 and 113, which were described in connection with FIGS. 10 and 11, are not required.

The permanent magnets used in the present invention may be the same as conventional permanent magnets. Usable permanent magnets include, but are not limited to, ferrite magnets, rare-earth (e.g., Nd-based or Sm-based) magnets, and the like. Preferably, they may be selected from among Nd—Fe—B, Sm—Co and Sm—N—Fe magnets. No particular limitation is placed on the shape of the permanent magnets. However, a shape similar to that of the formed pole pieces is preferred, and examples thereof include discoidal and square shapes. In order to secure sufficient magnetic efficiency and magnetic field uniformity, the base area of the permanent magnets should preferably comprises 102 to 105% of the base area of the pole pieces, though it depends on the weights, volumes and materials of the permanent magnets and the pole pieces. The direction of magnetization should preferably be a direction perpendicular to the opposed faces of the permanent magnets (i.e., the direction of the thickness).

The magnetic field generator of the present invention has an inlet through which a subject is carried into the space between the pole pieces. Moreover, the magnetic field generator of the present invention may have base yokes (e.g., plate-like yokes) disposed outside the combination of permanent magnets to support the permanent magnets, and a yoke (e.g., a columnar yoke) disposed on one lateral side of the base yokes to connect the base yokes and thereby maintain a constant distance between the permanent magnets. These yokes are formed chiefly of soft iron.

No particular limitation is placed on the transmission coils and table used in the present invention, and there may be used any conventional ones.

Now, the magnetic field generator of FIG. 9 in accordance with an embodiment of the present invention is described in comparison with the magnetic field generator of FIG. 11 constructed according to the prior art. In both cases, there were used permanent magnets comprising Nd—Fe—B magnet bases having a maximum energy product of 350 kJ/m$^3$, and pole pieces-formed of low-carbon steel. The magnetic field regulation mechanisms comprised copper wires, an acrylic resin, and iron pieces for fine adjustment. In the inclined magnetic field generator of FIG. 9, the Z, X and Y wired coils shown in FIG. 6 were arranged in that order from top to bottom. Although no hole was formed in the X and Y layers, it may be possible that holes formed in the Z layer extend through the X and Y layers and reach the pole piece.

In the comparative example illustrated in FIG. 11, the values of various gap-side distances and thicknesses were as follows: distance between peripheral projections (L0)=400 mm; distance between inclined magnetic field coil surfaces (L1)=420 mm; thickness of each transmission coil (Ts)=10 mm; thickness of each magnetic field regulation mechanism (Tb)=10 mm; and thickness of subject carrying table (Tt)=30 mm.

Then, the effective gap length (Lg) can be calculated according to the aforesaid equation (1) as follows:

$Lg=L0-(2\times Ts+Tt)=350$ mm

Alternatively, it can be calculated according to equation (2) as follows:

$Lg=L1-\{2\times(Ts+Tb)+Tt\}=350$ mm

FIG. 9 illustrates an example involving the addition of an inclined magnetic field generator comprising an inclined magnetic field coil, a magnetic field regulation mechanism, and a resin base. In the magnetic field regulation mechanism as shown in this example, the total cross-sectional areas of magnetic field regulating holes are about 20% in the cross-sectional area of the inclined magnetic field generator. The inclined magnetic field coil is placed in the pole piece in this example. In this example, the magnetic field regulation mechanism which had been used in the prior art is omitted and replaced by a transmission coil.

Then, the effective gap length (Lg) can be calculated according to the aforesaid equation (1) as follows:

$$Lg=L0-Tt=370 \text{ mm}$$

Alternatively, it can be calculated according to equation (2) as follows:

$$Lg=L1-\{2 \times Ts+Tt\}=370 \text{ mm}$$

Thus, the gap could be widened by the thickness of two magnetic field regulation mechanisms (2×Tb×2×10=20 mm).

The magnetic field uniformity was the same (70 ppm) as that of the comparative example. Magnetic field uniformity was determined by measuring magnetic field strengths with a tesla meter (NMR measuring instrument) and then calculating the value of {[(maximum value)−(minimum value)]/(mean value)}.

The invention claimed is:

1. An inclined magnetic field generation coil assembly for use in a magnetic field generator for MRI, the coil assembly comprising:
    a resin base having a plurality of magnetic field regulating holes therein;
    an electric conductor coil positioned so that a magnetic field is generated adjacent the magnetic field regulating holes; and
    magnet pieces positioned in one or more of the magnetic field regulating holes while others of the magnetic field regulating holes are vacant to thereby adjust the magnetic field.

2. The inclined magnetic field generation coil defined in claim 1 wherein the resin base comprises one or more insulation resins selected from the group consisting of acrylic resins, epoxy resins, silicone resins, polyimides and reinforced plastics.

3. A magnetic field generator assembly for MRI comprising:
    a pair of permanent magnets magnetized in a direction of a thickness thereof and opposed to each other with a gap therebetween; and
    a pair of pole pieces having a peripheral projection and disposed on the opposed faces of the respective permanent magnets, wherein a magnet field space is between the pole pieces;
    an inclined magnetic field generator disposed within each of the pole pieces and having a means for regulating the magnetic field of the magnet field space,
    wherein the means for regulating the magnetic field of the magnet field space comprises:
        magnetic field regulating holes and magnet pieces positioned in one or more of the magnetic field regulating holes while others of the magnetic field regulating holes are vacant to thereby adjust the magnetic field of the magnet field space.

4. The magnetic field generator assembly defined in claim 3 wherein a percentage of total cross-sectional areas of the magnetic field regulating holes in a cross-sectional area off the inclined magnetic field generator within the pole piece is 3 to 80%.

5. The magnetic field generator assembly defined in claim 3 wherein the magnetic field regulating holes extend from the gap side to one of: a pole piece side of the generator; holes formed in a surface on a gap side of the generator; and holes formed in a surface on a pole piece side of the generator.

6. A magnetic field generator assembly for MRI comprising:
    a pair of permanent magnets magnetized in the direction of a thickness thereof and opposed to each other with a gap therebetween; and
    a pair of pole pieces having a peripheral projection and disposed on opposed faces of the respective permanent magnets, wherein a magnet field space is between the pole pieces;
    an inclined magnetic field generator disposed within each of the pole pieces and having a means for regulating a magnetic field of the magnet field space, wherein the inclined magnetic field generator comprises:
        a resin base having a plurality of magnetic field regulating holes therein;
        an electric conductor coil positioned so that a magnetic field is generated adjacent the magnetic field regulating holes; and
        magnet pieces positioned in one or more of the magnetic field regulating holes while others of the magnetic field regulating holes are vacant to thereby adjust the magnetic field, wherein the magnetic field regulating holes are configured so as not to interfere with the electric conductor coil.

7. The magnetic field generator defined in claim 6 wherein a percentage of total cross-sectional areas of the magnetic field regulating holes in a cross-sectional area of the inclined magnetic field generator within the pole piece is 3 to 80%.

8. The magnetic field generator defined in claim 6 wherein the magnetic field regulating holes extend from the gap side to one of a pole piece side of the generator; holes formed in a surface on a gap side of the generator; or holes formed in a surface on a pole piece side of the generator.

* * * * *